US005260956A

United States Patent [19]
Inaba et al.

[11] Patent Number: 5,260,956
[45] Date of Patent: Nov. 9, 1993

[54] LASER DRIVE CIRCUIT

[75] Inventors: Naoto Inaba, Tokyo; Takashi Tanemura, Yamato; Hiroshi Meguro, Yokohama, all of Japan

[73] Assignee: Nikon Corporation, Tokyo, Japan

[21] Appl. No.: 948,429

[22] Filed: Sep. 22, 1992

[30] Foreign Application Priority Data

Sep. 30, 1991 [JP] Japan .................................. 3-251568
Nov. 5, 1991 [JP] Japan .................................. 3-288623
Nov. 12, 1991 [JP] Japan .................................. 3-295467

[51] Int. Cl.$^5$ .............................................. H01S 3/00
[52] U.S. Cl. ................................................... 372/38
[58] Field of Search ............................. 372/38, 31, 43

[56] References Cited

U.S. PATENT DOCUMENTS 5,146,464 9/1992 Uemura ................................ 372/38
5,177,755 1/1993 Johnson ............................... 372/38

FOREIGN PATENT DOCUMENTS

2-166636 6/1990 Japan .

Primary Examiner—John D. Lee
Assistant Examiner—Robert E. Wise
Attorney, Agent, or Firm—Shapiro and Shapiro

[57] ABSTRACT

A laser drive circuit for modulating a laser beam intensity emitted from a laser device to a maximum power and a minimum power in accordance with a first and second values of a binary signal comprises: a photodetector for detecting the laser beam emitted from the laser device to produce a detection output signal; a first differential amplifier for producing a maximum error detection signal representing a difference between the detection output signal applied thereto and a maximum reference; a second differential amplifier for producing a minimum error detection signal representing a difference between the detection output signal applied thereto and a minimum reference, a first sample and hold circuit for sampling and holding the maximum error detection signal at a timing of the first value of the binary signal and outputting the same as a maximum error signal; a second sample and hold circuit for sampling and holding the minimum error detection signal at a timing of the second value of the binary signal and outputting the same as a minimum error signal; and a laser drive amplifier for controlling the maximum power and the minimum power of the laser beam emitted from the laser device in accordance with the maximum error signal and the minimum error signal.

3 Claims, 7 Drawing Sheets

LASER DRIVE CIRCUIT

BACKGROUND OF THE INVENTION

1. Field of the Invention

The present invention relates to a laser drive circuit for controlling a laser beam such as a magneto-optical disk drive, and more particularly to a laser drive circuit for precisely controlling a laser beam intensity.

2. Related Background Art

In a prior art magneto-optical disk drive, a laser beam is irradiated to a recording medium having a magnetic film having a vertical magnetic anisotropy to locally raise a temperature while an external magnetic field is applied to orient the magnetization at the local point along a direction of the magnetic field.

In the magneto-optical recording, since the light beam and the magnetic field are used, a magnetic field modulation system in which a signal is converted to a magnetic field for recording, or a light modulation system in which the signal is converted to the turn-on and the turn-off of a laser beam for recording may be used. In the light modulation system, a magnetic field is applied along a direction of record and the signal is recorded by turning on and off the laser beam.

In the light modulation system, since the laser beam is turned on and off, a laser drive circuit for modulating a laser beam power between a maximum power and a minimum power in accordance with the values (binary values) of the record signal is required.

Figure 1:
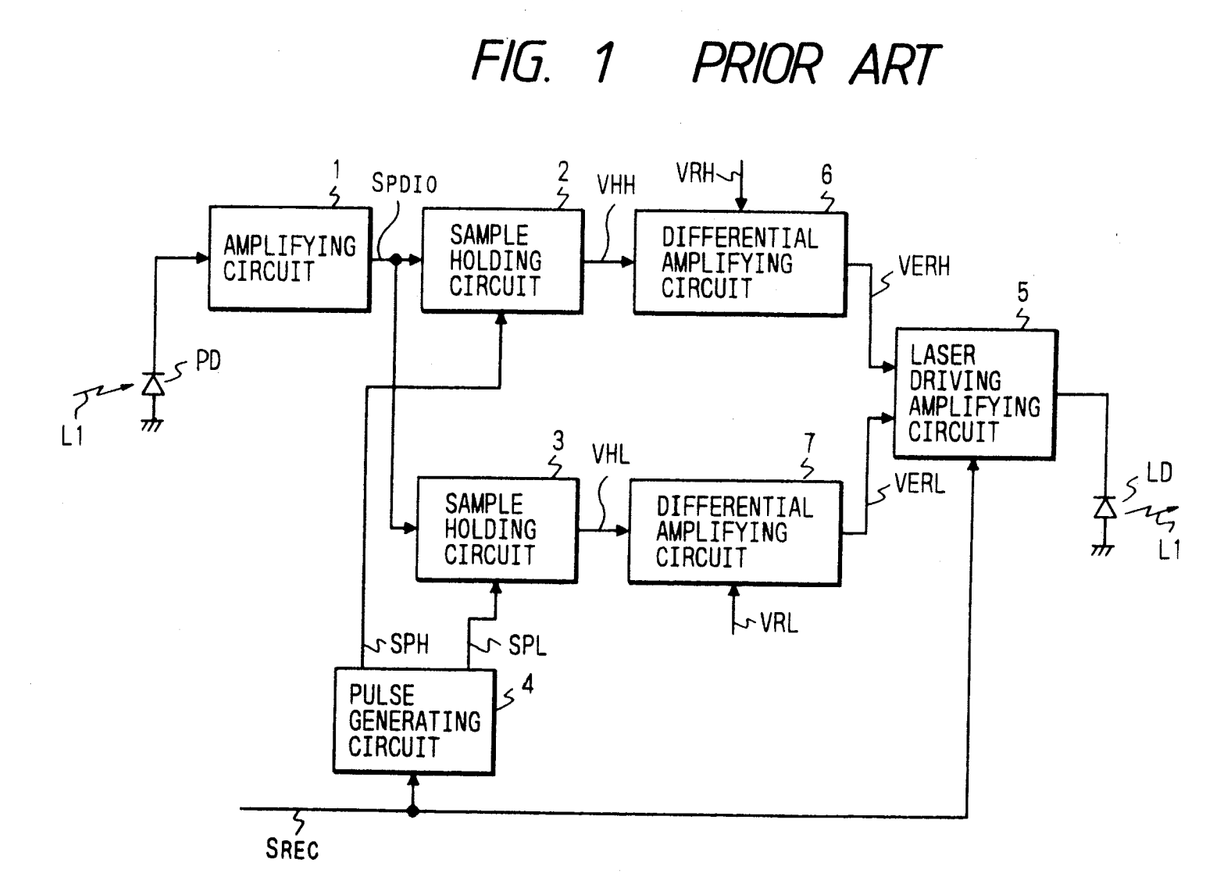
FIG. 1 shows a configuration of a prior art laser drive circuit.

FIG. 1 shows a configuration of a prior art laser drive circuit disclosed in Japanese Laid-Open Patent Application No. 2-166636. A portion of a laser beam L1 emitted from a semiconductor laser LD is detected by a photodetector PD. The detection output is amplified by an amplifier 1 which produces a detection signal $S_{PDIO}$, which is applied to two sample-and-hold circuits 2 and 3 which sample and hold the detection signal. A timing of the sampling and the holding is controlled by a pulse generator 4 which receives a record signal $S_{REC}$ and generates a sampling pulse $S_{PH}$ at the rise of the record signal $S_{REC}$ and generates a sampling pulse $S_{PL}$ at the fall of the record signal $S_{REC}$. The timing of the sampling and the holding is determined in accordance with the condition of the record signal. When the record signal $S_{REC}$ is at an H-level, a laser beam intensity from the semiconductor laser LD is maximum, and when it is at an L-level, the laser beam intensity from the semiconductor laser LD is minimum. The control to modulate the laser beam intensity in this manner is conducted by a laser drive amplifier 5.

When the record signal $S_{REC}$ is at the H-level, the detection signal $S_{PDIO}$ is sampled and held by the sample and hold circuit 2, and when the record signal $S_{REC}$ is at the L-level, the detection signal $S_{PDIO}$ is sampled and held by the sample and hold circuit 3. The timing of the sampling and the holding is controlled by the pulse generator 4, which receives the record signal $S_{REC}$ and generates the sampling pulse $S_{PH}$ at the rise of the record signal $S_{REC}$ and generates the sampling pulse $S_{PL}$ at the fall of the record signal $S_{REC}$.

The hold voltages $V_{HH}$ and $V_{HL}$ produced by sampling and holding by the two sample and hold circuits 2 and 3 are applied to differential amplifiers 6 and 7, respectively. The differential amplifier 6 produces a maximum error voltage $V_{ERH}$ which is a difference between the hold voltage $V_{HH}$ and a maximum reference voltage $V_{RH}$, and the differential amplifier 7 produces a minimum error voltage $V_{ERL}$ which is a difference between the hold voltage $V_{HL}$ and a minimum reference voltage $V_{RL}$. The maximum error voltage $V_{ERH}$ and the minimum error voltage $V_{ERL}$ are applied to the laser drive amplifier 5 so that a maximum power and a minimum power of the laser beam L1 of the semiconductor laser LD are feedback-controlled.

Figure 2:
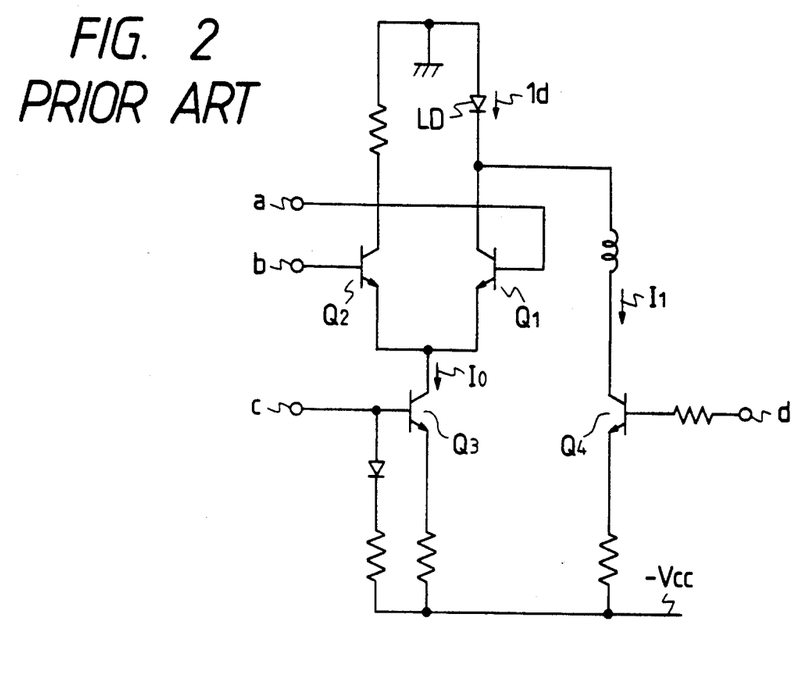
FIG. 2 shows a configuration of a laser drive amplifier in FIG. 1.

FIG. 2 shows a configuration of the laser drive amplifier 5 disclosed in the above-mentioned Japanese Laid-Open Patent Application No. 2-166636. In the laser drive amplifier 5, the record signal $S_{REC}$ and an inverted record signal are applied to first and second input terminals a and b, and the maximum error voltage $V_{ERH}$ and the minimum error voltage $V_{ERL}$ are applied to third and fourth input terminals c and d.

The laser drive amplifier 5 controls the laser drive current Id in accordance with the level of the input record signal $S_{REC}$ so that the laser beam at the minimum power or the maximum power is emitted from the semiconductor laser LD.

In this manner, the laser beam emitted from the semiconductor laser is modulated between the maximum power and the minimum power, and the maximum power and the minimum power are separately feedback-controlled.

By the above configuration, the laser beam intensity is controlled to the predetermined maximum power or minimum power.

The prior art laser drive circuit of the magneto-optical disk drive has the following disadvantages.

An operational characteristic of the sample and hold circuit in the prior art laser drive circuit generally includes a linearity error and a gain error.

Figure 3:
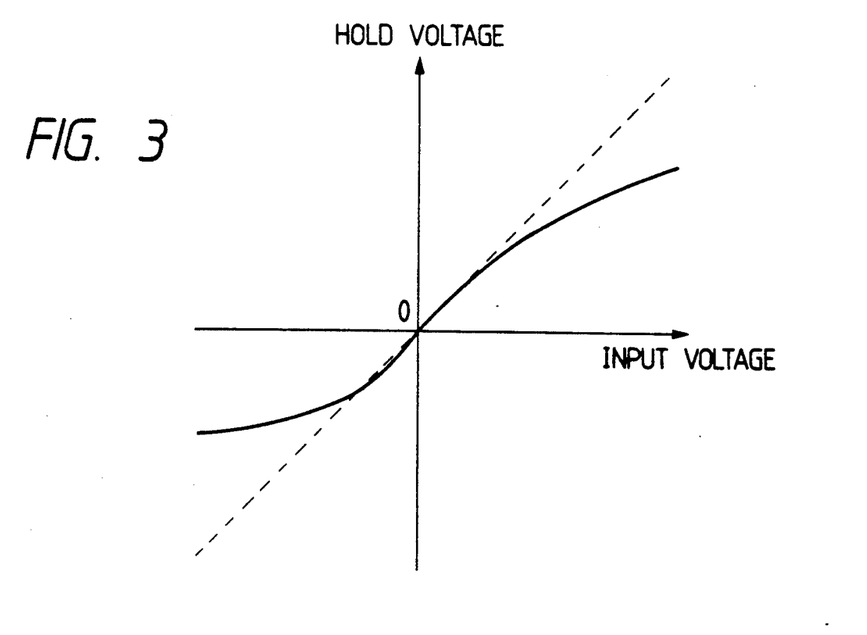
FIG. 3 shows a relationship between an input voltage and a hold voltage of a sample and hold circuit.

The linearity error and the gain error are further explained. An input voltage and a hold voltage of the sample and hold circuit have a relationship as shown in FIG. 3. A characteristic between the input voltage and the hold voltage generally includes the linearity error and the gain error.

Theoretically, the input voltage and the hold voltage are in a proportional relationship, but in actual a graph showing the relationship therebetween is not linear as shown in FIG. 3 in which the increase of the hold voltage decreases as the input voltage becomes higher. An error caused by this characteristic is called the linearity error. Thus, the linearity error is larger as the input voltage becomes higher.

Theoretically, a gain of the hold voltage to the input voltage is unity (that is, a graph of the input voltage versus the hold voltage is a straight line with a unity gradient), but in actual it is smaller than unity. An error caused by this characteristic is called the gain error.

The hold voltage produced by the sample and hold circuit includes the errors due to the linearity error and the gain error. When such a hold voltage is fed back to the semiconductor laser to control the laser beam intensity, it is not possible to exactly control the laser beam intensity to the predetermined level.

When a sample and hold circuit with a small error is to be designed, a construction is complex and a cost is high.

Further, it is required that the modulation of the laser beam power between the maximum power and the minimum power is done at a high speed. This requirement is further emphasized when a higher recording density of the optical recording medium is desired. In order to modulate the laser beam at the high speed, it is necessary that the sample and hold circuit operates at the high speed, but the above error is larger in a high speed sample and hold circuit. To reduce the error, the cost is higher.

The above problems occur in the record mode as well as in the reproduction and erase modes. In the prior art laser drive circuit, since the detection signal from the photo-detector is applied to the sample and hold circuit even in the reproduction and erase modes, it is affected by the linearity error and the gain error so that the laser beam intensity cannot be exactly controlled to the predetermined level.

In the prior art laser drive circuit, when the minimum reference voltage is varied in the differential amplifier 6 to vary the minimum error voltage applied to the input terminal d (see FIG. 3) of the laser drive amplifier 7, a current I1 which flows in a transistor Q4 also varies. As a result, when a transistor Q3 is activated, the maximum power of the laser beam varies with the change of the current. In order to prevent the change of the maximum power, the maximum error voltage must be set in accordance with the change of the minimum error voltage, and the control is complex.

SUMMARY OF THE INVENTION

It is an object of the present invention to provide a laser drive circuit which does not cause the deterioration of the controllability of a laser beam intensity by the affect of a linearity error and a gain error of a sample and hold circuit.

It is another object of the present invention to provide a laser drive circuit which can maintain a maximum or minimum power of a laser beam when the other power is varied.

In order to achieve the above objects, the present invention provides a laser drive circuit for modulating a laser beam intensity emitted from a laser device to a maximum power and a minimum power in accordance with a first and second values of a binary signal, comprising: a photo-detector for detecting the laser beam emitted from the laser device to produce a detection output signal; a first differential amplifier for producing a maximum error detection signal representing a difference between the detection output signal applied thereto and a maximum reference; a second differential amplifier for producing a minimum error detection signal representing a difference between the detection output signal applied thereto and a minimum reference; a first sample and hold circuit for sampling and holding the maximum error detection signal at a timing of the first value of the binary signal and outputting the same as a maximum error signal; a second sample and hold circuit for sampling and holding the minimum error detection signal at a timing of the second value of the binary signal and outputting the same as a minimum error signal; and a laser drive amplifier for controlling the maximum power and the minimum power of the laser beam emitted from the laser device in accordance with the maximum error signal and the minimum error signal.

In the above construction, the detection output signal from the photo-detector for detecting the laser beam is applied to the first and second differential amplifiers. The first differential amplifiers produces the maximum error detection signal, which is held by the first sample and hold circuit. The second differential amplifier produces the minimum error detection signal, which is held by the second sample and hold circuit. The timing of holding by those two sample and hold circuits is such that the first sample and hold circuit holds it when the record signal is of the first value, and the second sample and hold circuit holds it when the record signal is of the second value. The signals held by the two sample and hold circuits represent the errors to the maximum power and the minimum power, respectively, of the laser beam emitted. Accordingly, by feeding back the outputs of the two sample and hold circuits to the laser drive amplifier, the laser beam intensity emitted from the laser device may be controlled to the predetermined maximum power or minimum power.

In accordance with another aspect of the present invention, there is provided a laser drive circuit comprising: a monitor for monitoring a laser beam; a sample and hold circuit for sampling and holding an output of the monitor; a differential amplifier for producing a first error signal representing a difference between a level of a hold signal sampled and held by the sample and hold circuit and a predetermined first reference; an error detection circuit for producing a second error signal representing a difference between an output level of the monitor and a predetermined second reference, a laser driver for controlling a laser beam intensity in accordance with the first error signal or the second error signal; and a switch for selectively applying to the laser driver the first error signal when the laser beam is modulated and the second error signal when the laser beam is not modulated.

In accordance with other aspect of the present invention, there is provided a laser drive circuit comprising: a monitor for monitoring a laser beam; a differential amplifier for producing a first error signal representing a difference between an output from the monitor and a predetermined first reference; a sample and hold circuit for sampling and holding the first error signal; an error detection circuit for producing a second error signal representing a difference between the output level of the monitor and a predetermined second reference; a laser driver for controlling a laser beam intensity in accordance with a hold signal sampled and held by the sample and hold circuit and the second error signal; and a switch for selectively supplying to the laser driver the hold signal when the laser beam is modulated and the second error signal when the laser beam is not modulated.

In the above construction, when the laser beam is not modulated, the output from the monitor for monitoring the laser beam is applied to the laser driver through the error detection circuit so that it is not affected by the sample and hold circuit.

When the laser beam is modulated, the first error signal which represents the difference between the output from the monitor and the first reference is produced by the differential amplifier and it is supplied to the sample and hold circuit so that the affect of the linearity error and the gain error of the sample and hold circuit is eliminated.

In accordance with a further aspect of the present invention, there is provided a laser drive circuit comprising: a first output setting circuit for setting a first setting corresponding to a minimum power of a laser beam emitted from a laser drive; a second output setting circuit for setting a second setting corresponding to a maximum power of the laser beam; a subtractor for producing a difference between the second setting and the first setting; and a laser drive amplifier for superimposing a signal corresponding to the output of the subtractor onto a signal representing the first setting and supplying the superimposed signal to the laser device.

In the above construction, the first output setting circuit sets the first setting corresponding to the minimum power of the laser beam of the laser device and supplies it to the subtractor and the laser drive amplifier, and the second output setting circuit sets the second setting corresponding to the maximum power of the laser beam and supplies it to the subtractor, which subtracts the first setting from the second setting and supplies the resulting output to the laser drive amplifier, which in turn superimposes a pulsive signal having an amplitude corresponding to the output of the subtractor to the signal representing the first setting of the first output setting circuit at a predetermined interval and supplies the superimposed signal to the laser device.

DETAILED DESCRIPTION OF THE PREFERRED EMBODIMENTS

Figure 4:
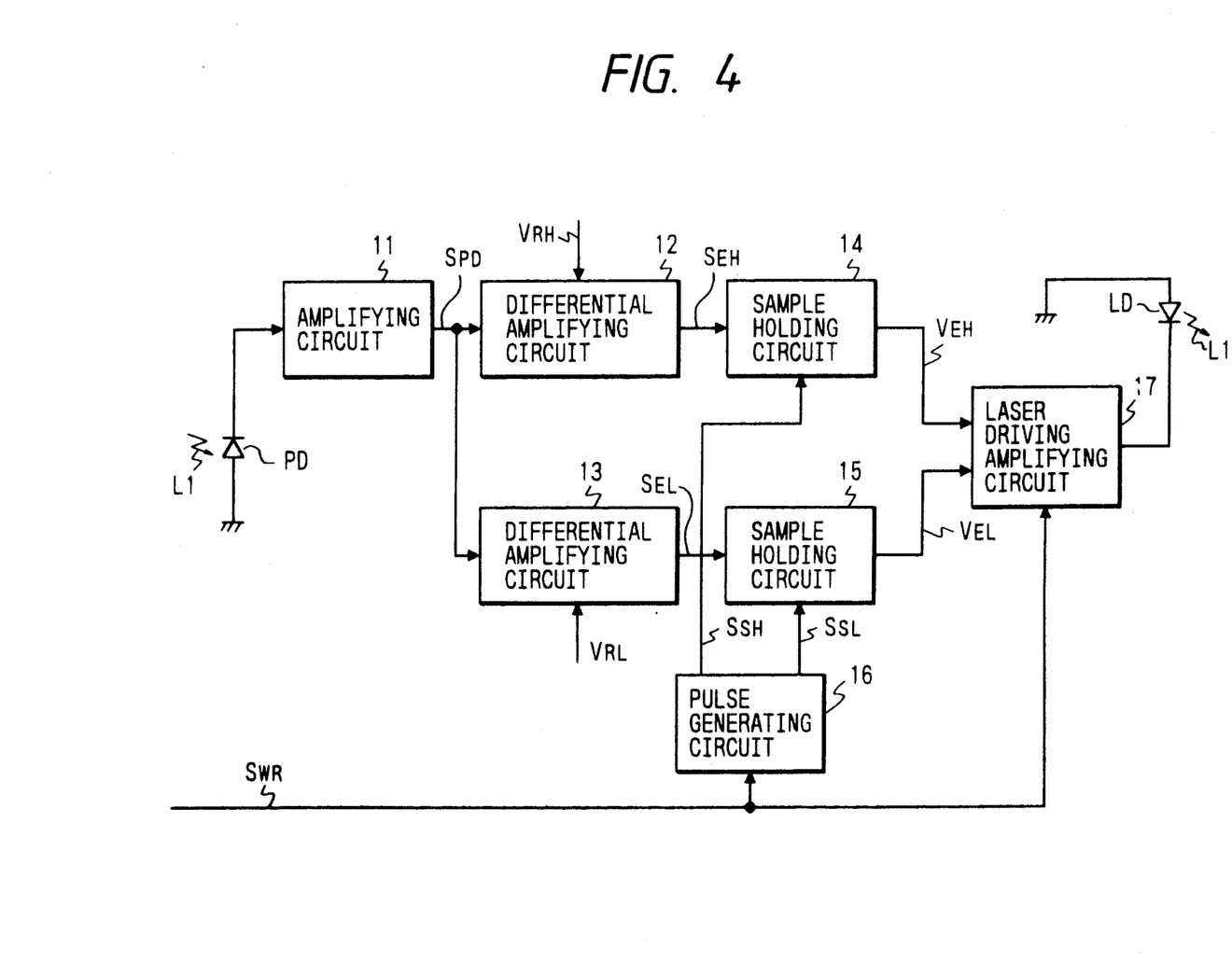
FIG. 4 shows a block diagram of a configuration of a laser drive circuit in accordance with a first embodiment of the present invention.
Figure 5A:
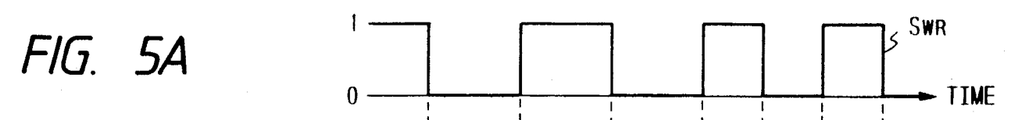
FIGS. 5A to 5F show timing charts of an operation of the laser drive circuit in the first embodiment of the present invention.
Figure 5B:
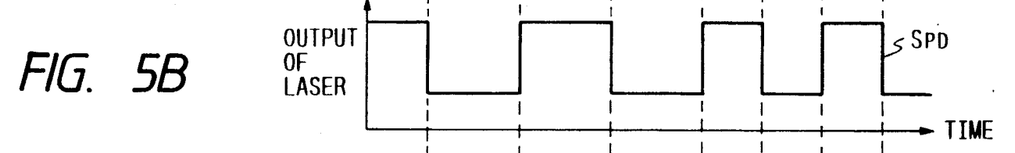
Figure 5C:
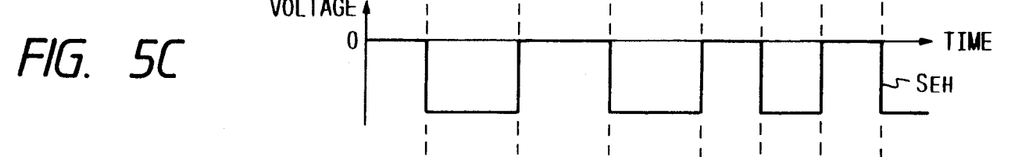
Figure 5D:
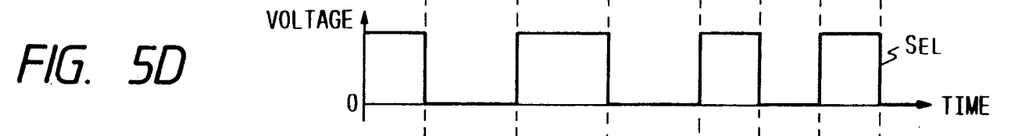
Figure 5E:
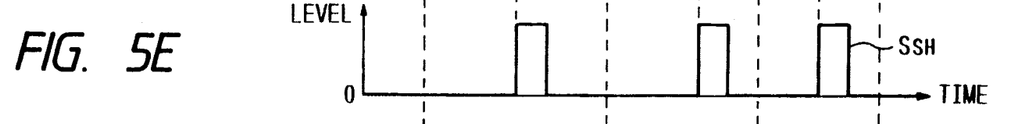
Figure 5F:
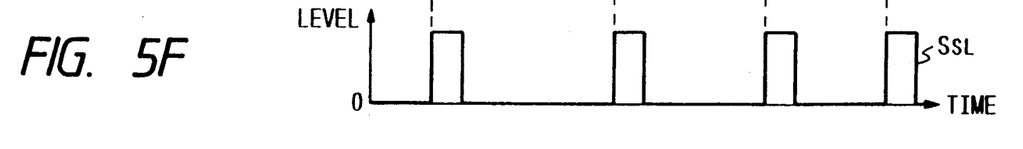

FIG. 4 shows a block diagram of a configuration of a laser drive circuit in accordance with a first embodiment of the present invention, and FIGS. 5A to 5F show timing charts for explaining an operation of the laser drive circuit.

In FIG. 4, a portion of a laser beam L1 emitted from a semiconductor laser LD is detected by a photo-detector PD, and a detection output is applied to an amplifier 1 where it is amplified. An amplified detection output signal $S_{PD}$ (FIG. 5B) from the amplifier 11 is applied to a first differential amplifier 12 and a second differential amplifier 13.

The detection output signal $S_{PD}$ applied to the first differential amplifier 12 is compared with a maximum reference voltage $V_{RH}$ (which is applied to the first differential amplifier 12) to determine a difference between $S_{PD}$ and $V_{RH}$ to produce a maximum error detection signal $S_{EH}$ (see FIG. 5C), which is applied to a first sample and hold circuit 14.

The detection output signal $S_{PD}$ applied to the second differential amplifier 13 is compared with a minimum reference voltage $V_{RL}$ (which is applied to the second differential amplifier 13) to determine a difference between $S_{PD}$ and $V_{RL}$ to produce a minimum error detection signal $S_{EL}$ (FIG. 5D), which is applied to a second sample and hold circuit 15.

The first sample and hold circuit 14 and the second sample and hold circuit 15 sample and hold the maximum error detection signal $S_{EH}$ and the minimum error detection $S_{EL}$ applied thereto, respectively, at a timing of a first sampling pulse $S_{SH}$ and a second sampling pulse $S_{SL}$, respectively, applied from a pulse generator 16.

A first hold voltage (an output of the first sample and hold circuit 14) and a second hold voltage (an output of the second sample and hold circuit 15) produced by the sampling and the holding are applied to a laser drive amplifier 5 as the maximum error voltage $V_{EH}$ and the minimum error voltage $V_{EL}$, respectively.

A record signal $S_{WR}$ (see FIG. 5A) is applied to the pulse generator 16. The detection output from the photo-detector PD has a waveform which depends on the record signal $S_{WR}$. Accordingly, the detection output signal $S_{PD}$ (which is the amplified version of the detection output) from the amplifier 11 has a waveform which depends on the record signal $S_{WR}$ (see FIG. 5B). The pulse generator 16 generates a first sampling pulse $S_{SH}$ (see FIG. 5E) which rises at a rise timing of the record signal $S_{WR}$ and a second sampling pulse $S_{SL}$ (see FIG. 5F) which rises at a fall timing of the record signal $S_{WR}$. The first sampling pulse $S_{SH}$ is applied to the first sample and hold circuit 14 and the second sampling pulse $S_{SL}$ is applied to the second sample and hold circuit, and they are sampled and held by the sample and hold circuits, respectively.

In the laser drive amplifier 5, the record signal $S_{WR}$ and the inverted record signal are applied to first and second input terminals a and b, respectively, and the maximum error voltage $V_{EH}$ and the minimum error voltage $V_{EL}$ are applied to third and fourth input terminals c and d, respectively.

In the laser drive amplifier 5, the laser drive current $I_{LD}$ is switched in accordance with the level of the input record signal $S_{WR}$ so that the laser beam of the minimum power or the maximum power is emitted from the semiconductor laser LD.

In the present laser drive circuit, a separate feedback loop is configured for each of the maximum power and the minimum power of the laser beam L1 as a whole laser drive circuit.

In the laser drive circuit, the feedback loop functions to keep the hold voltages of the first sample and hold circuit 14 and the second sample and hold circuit 15 at zero volt, because the feedback loop acts to keep the maximum error detection signal $S_{EH}$ and the minimum error detection signal $S_{EL}$ produced by the differential amplifiers 12 and 13 at zero level.

In the present laser drive circuit, the first and second sample and hold circuits operate around zero hold voltage when the feedback loop is relatively stable. As a result, the sample and hold circuits operate in a range in which the absolute values of the linearity error and the gain error in FIG. 3 are small.

In accordance with the present invention, even if the input level versus hold level characteristic of the sample and hold circuit includes the linearity error and the gain error, those errors hardly appear in the output of the sample and hold circuit and the desired laser beam intensity is attained with a high precision.

Figure 6:
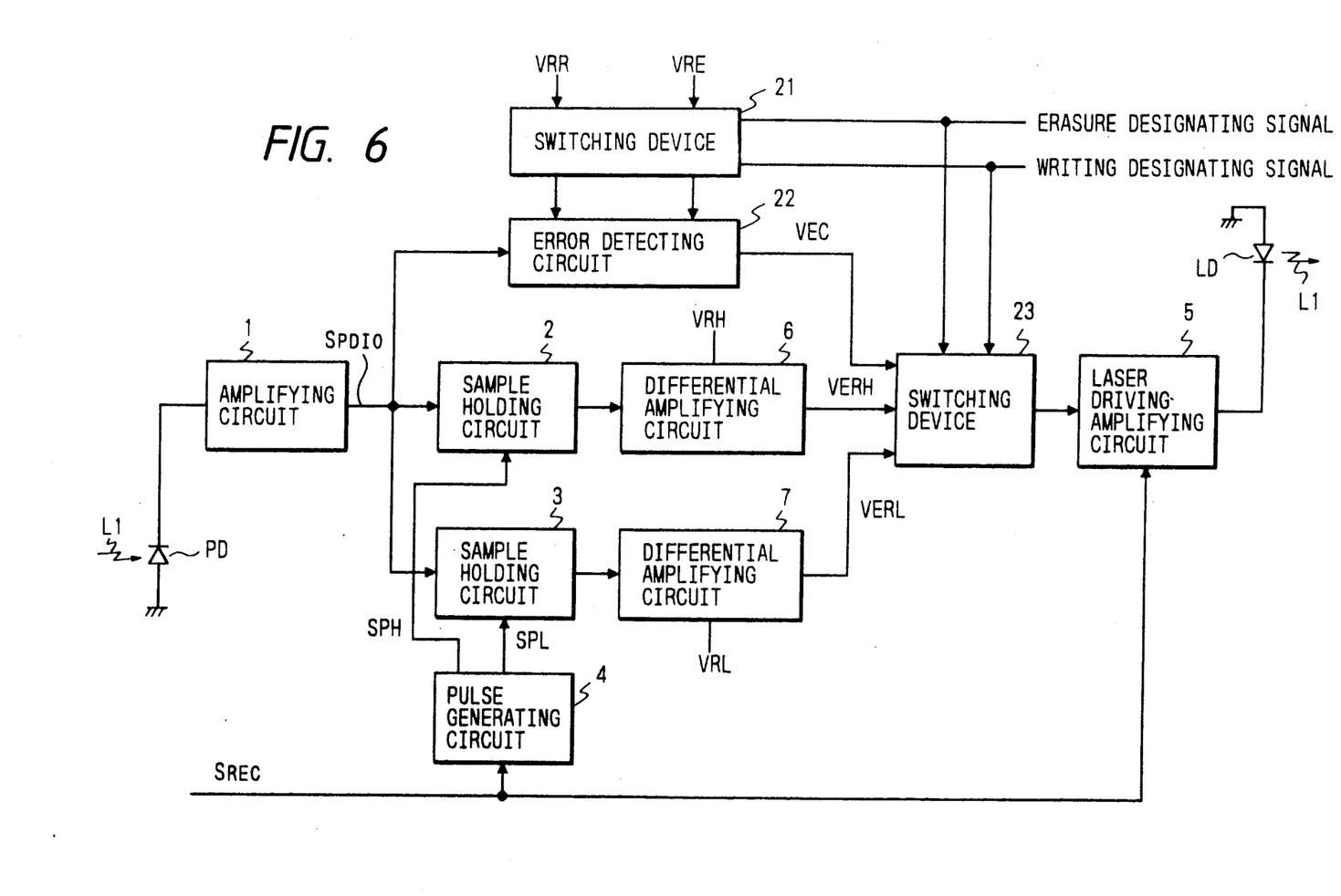
FIG. 6 shows a configuration of a laser drive circuit in accordance with a second embodiment of the present invention.

FIG. 6 shows a configuration of a laser drive circuit in accordance with a second embodiment of the present invention. Numerals 1 to 7 designate the same elements as those shown in FIG. 1. A reproduction reference voltage $V_{RR}$ which is a reference voltage in a reproduction mode and an erase reference voltage $V_{RE}$ which is a reference voltage in an erase mode are supplied to a switch 21. An erase status signal is applied to the switch 21. The erase status signal is generated when a magnetooptical disk drive erases a signal from a recording medium. When the erase status signal is generated, the switch 21 selects the erase reference voltage $V_{RE}$, and when the erase status signal is not generated, it selects the reproduction reference voltage $V_{RR}$.

An error detection circuit 22 compares the level of the detection output $S_{PDIO}$ from the amplifier 1 and the reference voltage (the reproduction reference voltage $V_{RR}$ or the erase reference voltage $V_{RE}$) from the switch 21 to produce an error detection signal $V_{EC}$ representing a difference therebetween.

The error detection signal $V_{EC}$ from the error detection circuit 22, and the maximum error voltage $V_{ERH}$ and the minimum error voltage $V_{ERL}$ from the differential amplifiers 6 and 7 are applied to a switch 23. A write status signal and the erase status signal are applied to the switch 23. The write status signal is generated when the magnetooptical disk drive records a signal to the recording medium. The write status signal and the erase status signal are produced by a control CPU which is external to the present circuit. When the write status signal is generated, the switch 23 selects the maximum error voltage $V_{ERH}$ and the minimum error voltage $V_{ERL}$, and when the erase status signal is generated or when more of the write status signal and the erase status signal is not generated, it selects the error detection signal $V_{EC}$. The output of the switch 23 is applied to the laser drive amplifier 5.

An operation of the present laser drive amplifier is explained below. An operation in the record mode is first explained. In the record mode, the write status signal is generated. The switch 23 selects the maximum error voltage $V_{ERH}$ and the minimum error voltage $V_{ERL}$ and applies them to the laser drive amplifier 5. As a result, the laser beam which is modulated between the maximum power and the minimum power can be feedback-controlled as it is in the prior art.

An operation in the erase mode is now explained. In the erase mode, the erase status signal is generated. The switch 21 selects the erase reference voltage $V_{RE}$ and applies it to the error detection circuit 22. The switch 23 selects the error detection signal $V_{EC}$ from the error detection circuit 22 and applies it to the laser drive amplifier 5. In the erase mode, the laser beam is not modulated. Accordingly, a control to keep the laser beam intensity at a constant level is conducted. The laser drive amplifier 5 controls to keep the laser beam intensity at the constant level in accordance with the error detection signal $V_{EC}$.

An operation in the reproduction mode is now explained. In the present embodiment, the reproduction mode is enabled when none of the write status signal and the erase status signal is generated. The switch 21 selects the reproduction reference voltage $V_{RR}$ and applies it to the error detection circuit 22. The switch 23 selects the error detection signal $V_{EC}$ from the error detection circuit 22 and applies it to the laser drive amplifier 5. In the reproduction mode, the laser beam is not modulated like in the erase mode. Accordingly, a control is conducted to keep the laser beam intensity at the constant level. The laser drive amplifier 5 controls to keep the laser light beam at the constant level in accordance with the error detection signal $V_{EC}$. The laser beam intensity in the reproduction mode is lower than those in the record mode and the erase mode.

In the erase mode and the reproduction mode in which the laser beam is not modulated, the error detection signal $V_{EC}$ applied to the laser drive amplifier 5 does not pass through the sample and hold circuit so that it is not affected by the gain error or the linearity error of the sample and hold circuit.

A third embodiment of the present invention is now explained. In the embodiment of FIG. 6, the affect of the linearity error and the gain error of the sample and hold circuit is eliminated in the reproduction mode and the erase mode, but the affect of the linearity error and the gain error is not eliminated in the record mode in which the laser beam is modulated. In the present embodiment, the affect of the linearity error and the gain error of the sample and hold circuit in the record mode can be reduced.

Figure 7:
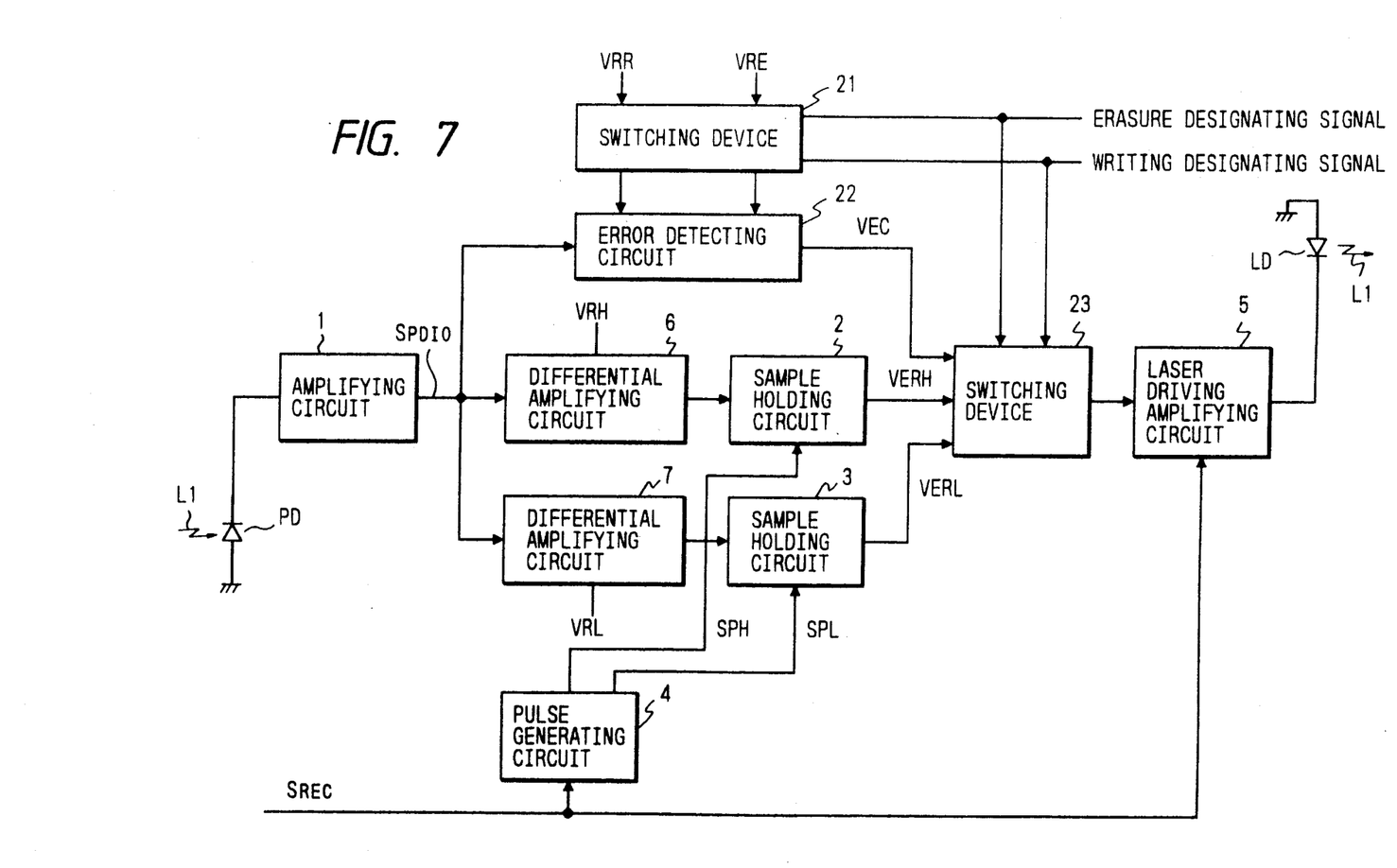
FIG. 7 shows a configuration of a laser drive circuit in accordance with a third embodiment of the present invention.

FIG. 7 shows a configuration of a laser drive circuit in accordance with the third embodiment of the present invention. It differs from the configuration of FIG. 6 in that the positions of the sample and hold circuits and the differential amplifiers are exchanged. In FIG. 7, the operation in the reproduction mode and the erase mode is identical to that of the embodiment of FIG. 6 and the explanation thereof is omitted.

An operation in the record mode is now explained. The detection signal $S_{PDIO}$ is applied to the differential amplifiers 6 and 7. The differential amplifier 6 compares the level of the detection signal $S_{PDIO}$ with the maximum reference voltage $V_{HH}$ to produce an error voltage representing a difference therebetween. The differential amplifier 7 compares the level of the detection signal $S_{PDIO}$ with the minimum reference voltage $V_{HL}$ to produce an error voltage representing a difference therebetween. Those error voltages are applied to the sample and hold circuits 2 and 3, respectively.

The sample and hold circuits 2 and 3 sample and hold the input error voltages at the timing of the sampling pulse from the pulse generator 4 as they do in the prior art. They produce the hold voltages as the maximum error voltage $V_{ERH}$ and the minimum error voltage $V_{ERL}$, respectively, which are applied to the laser drive amplifier 5 through the switch 23. The operations of the switch 23 and the laser drive amplifier 5 are same as those of the embodiment in FIG. 6.

In the embodiment of FIG. 6, the detection signal $S_{PDIO}$ is applied to the sample and hold circuit. In the present embodiment, the error voltage produced by the differential amplifier is applied to the sample and hold circuit. Since the feedback loop formed by the laser drive circuit controls the maximum power and the minimum power of the modulated laser beam in the record mode to the predetermined levels, it functions to keep the error voltage produced by the differential amplifier at zero level. Accordingly, the sample and hold circuit operates around the zero hold voltage in a relatively stable state of the feedback loop. As a result, the sample and hold circuit operates in a range in which the absolute values of the linearity error and the gain error in FIG. 2 are relatively small.

In the laser drive circuit of the embodiment of FIG. 7, the affect of the linearity error and the gain error of the sample and hold circuit is reduced in the feedback control of the laser beam intensity in the record mode in which the laser beam is modulated.

In the embodiments of FIGS. 6 and 7, when the magneto-optical disk drive is not in the record mode, the erase mode or the reproduction mode, the operation in the reproduction mode described above is varied out, and this does not raise a problem. In the embodiments of FIGS. 6 and 7, the write status signal and the erase status signal are externally applied although they may be other signals. For example, the write status signal, the erase status signal and a read status signal (which is generated in the reproduction mode) may be applied. Alternatively, a signal identifying the record mode or the erase mode and the write status signal may be applied.

In the embodiments of FIGS. 6 and 7, the maximum power and the minimum power are feedbackcontrolled in the record mode in which the laser beam is modulated although only one of them may be controlled. For example, where exact control is desired only for the maximum power, the feedback control may be conducted for only the maximum power. In this case, one sample and hold circuit and one differential amplifier are sufficient.

In the embodiments of FIGS. 6 and 7, the switch 23 is connected to the outputs of the error detection circuit 22 and the differential amplifiers 6 and 7 although it may be connected to the inputs of the error detection circuit 22 and the sample and hold circuits 2 and 3.

In the present invention, the laser beam intensity can be controlled with a high precision without being affected by the linearity error and the gain error of the sample and hold circuit.

Figure 8:
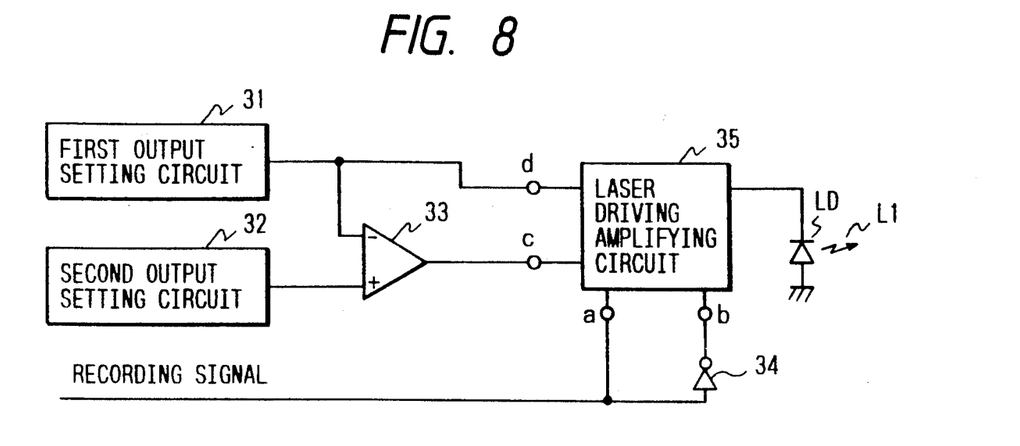
FIG. 8 shows a configuration of a laser drive circuit in accordance with a fourth embodiment of the present invention.

FIG. 8 shows a block diagram of a laser drive circuit in accordance with a fourth embodiment of the present invention, and FIGS. 9A-9D show waveforms for explaining an operation thereof.

A first output setting circuit 31 sets a first voltage V1 corresponding to the minimum power of the laser beam L1 of the semiconductor laser LD and supplies the set voltage to a negative input terminal of a subtractor 33 and the input terminal d of the laser drive amplifier 5. A second output setting circuit 32 sets a second voltage V2 corresponding to the maximum power of the laser beam L1 of the semiconductor laser LD and supplies the set voltage to a positive input terminal of the subtractor 33.

The first voltage V1 which is the output from the first output setting circuit 31 in FIG. 8 is equivalent to the output $V_{ERL}$ from the differential amplifier 7 in FIG. 1 or the output $V_{EL}$ from the sample and hold circuit 15 in FIG. 4. The first output setting circuit 31 may be the circuit comprising the differential amplifier 7 and the preceding stage thereof in FIG. 1, or the circuit comprising the sample and hold circuit 15 and the preceding stage thereof in FIG. 4.

The second voltage V2 which is the output from the second output setting circuit 32 in FIG. 8 is equivalent to the output $V_{ERH}$ from the differential amplifier 6 in FIG. 1 or the output $V_{EH}$ from the sample and hold circuit 14 in FIG. 4. The second output setting circuit 22 may be the circuit comprising the differential amplifier 6 and the preceding stage thereof in FIG. 1 or the circuit comprising the sample and hold circuit 14 and the preceding circuit thereof in FIG. 4.

Similarly, since the first voltage V1 and the second voltage V2 are equivalent to $V_{ERL}$ and $V_{ERH}$ in FIGS. 6 and 7, the circuits for outputting $V_{ERL}$ and $V_{ERH}$ in FIGS. 6 and 7 may be used as the first output setting circuit 31 and the second output setting circuit 32.

Figure 9A:
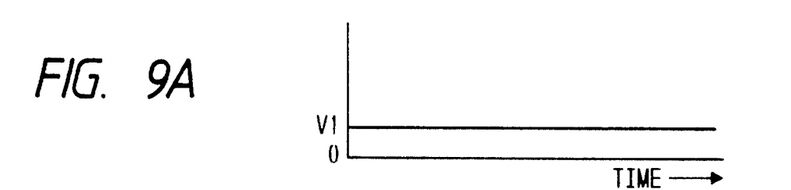
FIGS. 9A to 9D show waveforms for explaining an operation of the laser drive circuit in the fourth embodiment of the present invention.
Figure 9B:
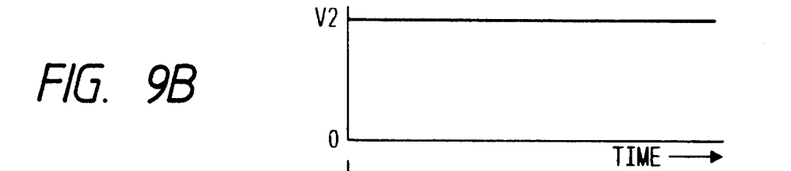

The voltage levels outputted by the first output setting circuit 31 and the second output setting circuit 32 may be set to any desired values, and those circuits output the voltages V1 and V2 of the predetermined magnitude of the predetermined polarity, as shown in FIGS. 9A and 9B.

Figure 9C:
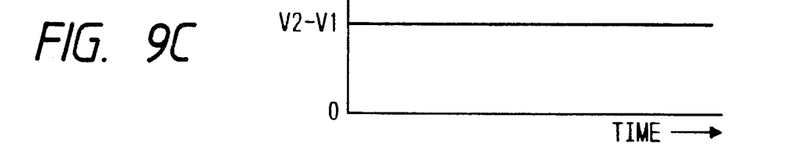

As shown in FIG. 9C, the subtractor 33 subtracts the first voltage V1 from the second voltage V2 to produce a voltage V2−V1, which is applied to the input terminal c of the laser drive amplifier 5, which is identical to that shown in FIG. 4. The record signal is applied to the input terminal a and the inverted record signal from the inverter 14 is applied to the input terminal b. The first voltage V1 from the first output setting circuit 31 is applied to the input terminal d.

An operation of the present laser drive circuit is now explained. The first output setting circuit 31 sets the first voltage V1 corresponding to the minimum power of the laser beam L1 of the semiconductor laser LD and supplies it to the subtractor 13 and the laser drive circuit 5. The second output setting circuit 32 sets the second voltage V2 corresponding to the maximum power of the laser beam L1 of the semiconductor laser LD and supplies it to the subtractor 13, which subtracts the first voltage V1 from the second voltage V2 and supplies the resulting voltage V2−V1 to the laser drive amplifier 5.

Figure 9D:
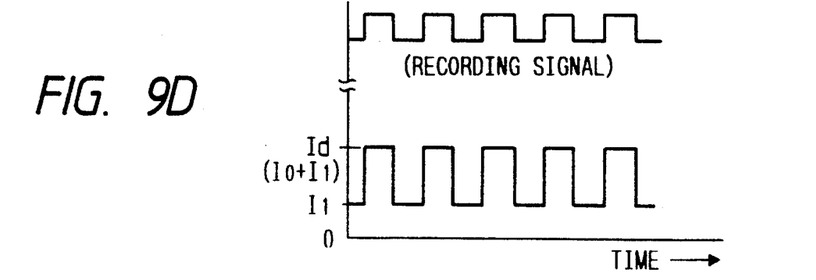

In the laser drive amplifier 5, a transistor Q1 is turned off and a transistor Q2 is turned on when the input record signal is at a low level so that a current I1 caused by the first voltage V1 applied to a transistor Q4 is supplied to the semiconductor laser LD. On the other hand, when the record signal is at a high level, the transistor Q1 is turned on and the transistor Q2 is turned off. As a result, a current Id which is a sum of the current I1 due to the first voltage V1 and a current I0 due to the output voltage V2−V1 of the subtractor 13 applied to the transistor Q3 is supplied to the semiconductor laser LD. In the laser drive amplifier 5, the control is made such that the current to be supplied to the semiconductor laser LD is switched in accordance with the level of the input record signal as shown in FIG. 9D.

In the present invention, the powers corresponding to the minimum power and the maximum power of the laser beam can be independently set by using the first output setting circuit, the second output setting circuit and the subtractor. Thus, even if one of the minimum power and the maximum power of the laser beam is varied, the other power does not follow it and the control of the power may be simply done.

What is claimed is:

1. A laser drive circuit for modulating a laser beam intensity emitted from a laser device to a maximum power and a minimum power in accordance with a first and second values of a binary signal, comprising:
   photo-detector means for detecting the laser beam emitted from said laser device to produce a detection output signal;
   first differential amplifier means for producing a maximum error detection signal representing a difference between the detection output signal applied thereto and a maximum reference;
   second differential amplifier means for producing a minimum error detection signal representing a difference between the detection output signal applied thereto and a minimum reference, first sample and hold means for sampling and holding the maximum error detection signal at a timing of the first value of the binary signal and outputting the same as a maximum error signal;

second sample and hold means for sampling and holding the minimum error detection signal at a timing of the second value of the binary signal and outputting the same as a minimum error signal; and laser drive amplifier means for controlling the maximum power and the minimum power of the laser beam emitted from the laser device in accordance with the maximum error signal and the minimum error signal.

2. A laser drive circuit comprising:

monitor means for monitoring a laser beam;

a sample and hold circuit for sampling and holding an output of said monitor means;

a differential amplifier for providing a first error signal representing a difference between a level of a hold signal sampled and held by said sample and hold circuit and a predetermined first reference;

an error detection circuit for producing a second error signal representing a difference between an output level of said monitor means and a predetermined second reference;

a laser driver for controlling a laser beam intensity in accordance with the first error signal or the second error signal; and switch means for selectively applying to said laser driver the first error signal when the laser beam is modulated and the second error signal when the laser beam is not modulated.

3. A laser drive circuit comprising:

monitor means for monitoring a laser beam;

a differential amplifier for producing a first error signal representing a difference between an output from said monitor means and a predetermined first reference;

a sample and hold circuit for sampling and holding the first error signal;

an error detection circuit for producing a second error signal representing a difference between the output level of said monitor means and a predetermined second reference;

a laser driver for controlling a laser beam intensity in accordance with a hold signal sampled and held by said sample and hold circuit and the second error signal; and switch means for selectively supplying to said laser driver the hold signal when the laser beam is modulated and the second error signal when the laser beam is not modulated.

* * * * *